(12) United States Patent
Miles

(10) Patent No.: US 7,642,110 B2
(45) Date of Patent: Jan. 5, 2010

(54) METHOD FOR FABRICATING A STRUCTURE FOR A MICROELECTROMECHANICAL SYSTEMS (MEMS) DEVICE

(75) Inventor: Mark W. Miles, San Francisco, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 0 days.

(21) Appl. No.: 11/830,750

(22) Filed: Jul. 30, 2007

(65) Prior Publication Data

US 2008/0026328 A1    Jan. 31, 2008

Related U.S. Application Data

(63) Continuation of application No. 10/941,042, filed on Sep. 14, 2004, now Pat. No. 7,250,315, which is a continuation of application No. 10/074,562, filed on Feb. 12, 2002, now Pat. No. 6,794,119.

(51) Int. Cl.
*H01L 21/00* (2006.01)
(52) U.S. Cl. ........................................ 438/29; 438/48
(58) Field of Classification Search .................. 438/29, 438/48–53
See application file for complete search history.

(56) References Cited

U.S. PATENT DOCUMENTS

| | | | |
|---|---|---|---|
| 2,534,846 A | 12/1950 | Ambrose et al. |
| 3,439,973 A | 4/1969 | Paul et al. |
| 3,443,854 A | 5/1969 | Weiss |
| 3,616,312 A | 10/1971 | McGriff et al. |
| 3,653,741 A | 4/1972 | Marks |
| 3,656,836 A | 4/1972 | de Cremoux et al. |
| 3,725,868 A | 4/1973 | Malmer, Jr. et al. |
| 3,728,030 A | 4/1973 | Hawes |
| 3,813,265 A | 5/1974 | Marks |
| 3,955,880 A | 5/1976 | Lierke |
| 4,099,854 A | 7/1978 | Decker et al. |
| 4,196,396 A | 4/1980 | Smith |
| 4,228,437 A | 10/1980 | Shelton |
| 4,377,324 A | 3/1983 | Durand et al. |

(Continued)

FOREIGN PATENT DOCUMENTS

CH              680534          9/1992

(Continued)

OTHER PUBLICATIONS

ISR for PCT/US02/13442 filed Apr. 29, 2002.

(Continued)

*Primary Examiner*—Savitri Mulpuri
(74) *Attorney, Agent, or Firm*—Knobbe Martens Olson & Bear LLP

(57) ABSTRACT

The invention provides a microfabrication process which may be used to manufacture a MEMS device. The process comprises depositing one or a stack of layers on a base layer, said one layer or an uppermost layer in said stack of layers being a sacrificial layer; patterning said one or a stack of layers to provide at least one aperture therethrough through which said base layer is exposed; depositing a photosensitive layer over said one or a stack of layers; and passing light through said at least one aperture to expose said photosensitive layer.

22 Claims, 10 Drawing Sheets

U.S. PATENT DOCUMENTS

| | | |
|---|---|---|
| 4,389,096 A | 6/1983 | Hori et al. |
| 4,392,711 A | 7/1983 | Moraw et al. |
| 4,403,248 A | 9/1983 | te Velde |
| 4,441,791 A | 4/1984 | Hornbeck |
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,617,608 A | 10/1986 | Blonder et al. |
| 4,662,746 A | 5/1987 | Hornbeck |
| 4,663,083 A | 5/1987 | Marks |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,859,060 A | 8/1989 | Kitagiri et al. |
| 4,900,136 A | 2/1990 | Goldburt et al. |
| 4,900,395 A | 2/1990 | Syverson et al. |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,982,184 A | 1/1991 | Kirkwood |
| 5,018,256 A | 5/1991 | Hornbeck |
| 5,022,745 A | 6/1991 | Zahowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,212,582 A | 5/1993 | Nelson |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,293,272 A | 3/1994 | Jannson et al. |
| 5,296,950 A | 3/1994 | Lin et al. |
| 5,299,041 A | 3/1994 | Morin et al. |
| 5,305,640 A | 4/1994 | Boysel et al. |
| 5,311,360 A | 5/1994 | Bloom et al. |
| 5,312,512 A | 5/1994 | Allman et al. |
| 5,312,513 A | 5/1994 | Florence et al. |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,330,617 A | 7/1994 | Haond |
| 5,331,454 A | 7/1994 | Hornbeck |
| 5,339,116 A | 8/1994 | Urbanus et al. |
| 5,345,328 A | 9/1994 | Fritz et al. |
| 5,347,377 A | 9/1994 | Revelli, Jr. et al. |
| 5,355,357 A | 10/1994 | Yamamori et al. |
| 5,358,601 A | 10/1994 | Cathey |
| 5,365,283 A | 11/1994 | Doherty et al. |
| 5,381,232 A | 1/1995 | van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,474,865 A | 12/1995 | Vasudev |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |
| 5,503,952 A | 4/1996 | Suzuki et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,563,398 A | 10/1996 | Sampsell |
| 5,567,334 A | 10/1996 | Baker et al. |
| 5,570,135 A | 10/1996 | Gove et al. |
| 5,578,976 A | 11/1996 | Yao |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |

| | | | | | | |
|---|---|---|---|---|---|---|
| 5,619,059 | A | 4/1997 | Li et al. | 6,099,132 A | 8/2000 | Kaeriyama |
| 5,619,365 | A | 4/1997 | Rhoades et al. | 6,100,872 A | 8/2000 | Aratani et al. |
| 5,619,366 | A | 4/1997 | Rhoads et al. | 6,104,525 A | 8/2000 | Min |
| 5,622,814 | A | 4/1997 | Miyata et al. | 6,113,239 A | 9/2000 | Sampsell et al. |
| 5,629,790 | A | 5/1997 | Neukermans et al. | 6,115,326 A | 9/2000 | Puma et al. |
| 5,633,652 | A | 5/1997 | Kanbe et al. | 6,147,790 A | 11/2000 | Meier et al. |
| 5,636,052 | A | 6/1997 | Arney et al. | 6,149,190 A | 11/2000 | Galvin et al. |
| 5,636,185 | A | 6/1997 | Brewer et al. | 6,158,156 A | 12/2000 | Patrick |
| 5,638,084 | A | 6/1997 | Kalt | 6,160,833 A | 12/2000 | Floyd et al. |
| 5,638,946 | A | 6/1997 | Zavracky | 6,165,890 A | 12/2000 | Kohl et al. |
| 5,641,391 | A | 6/1997 | Hunter et al. | 6,166,422 A | 12/2000 | Qian et al. |
| 5,646,768 | A | 7/1997 | Kaeiyama | 6,170,332 B1 | 1/2001 | MacDonald et al. |
| 5,647,819 | A | 7/1997 | Fujitia et al. | 6,172,797 B1 | 1/2001 | Huibers |
| 5,650,834 | A | 7/1997 | Nakagawa et al. | 6,180,428 B1 | 1/2001 | Peeters et al. |
| 5,650,881 | A | 7/1997 | Hornbeck | 6,194,323 B1 | 2/2001 | Downey et al. |
| 5,654,741 | A | 8/1997 | Sampsell et al. | 6,195,196 B1 | 2/2001 | Kimura et al. |
| 5,657,099 | A | 8/1997 | Doherty et al. | 6,201,633 B1 | 3/2001 | Peeters et al. |
| 5,659,374 | A | 8/1997 | Gale, Jr. et al. | 6,204,080 B1 | 3/2001 | Hwang |
| 5,661,591 | A | 8/1997 | Lin et al. | 6,215,221 B1 | 4/2001 | Cabuz et al. |
| 5,665,997 | A | 9/1997 | Weaver et al. | 6,229,683 B1 | 5/2001 | Goodwin-Johansson |
| 5,673,139 | A | 9/1997 | Johnson | 6,232,936 B1 | 5/2001 | Gove et al. |
| 5,673,785 | A | 10/1997 | Schlaak et al. | 6,243,149 B1 | 6/2001 | Swanson et al. |
| 5,674,757 | A | 10/1997 | Kim | 6,246,398 B1 | 6/2001 | Koo |
| 5,683,591 | A | 11/1997 | Offenberg | 6,249,039 B1 | 6/2001 | Harvey et al. |
| 5,703,710 | A | 12/1997 | Brinkman et al. | 6,282,010 B1 | 8/2001 | Sulzbach et al. |
| 5,706,022 | A | 1/1998 | Hato | 6,284,560 B1 | 9/2001 | Jech, Jr. et al. |
| 5,710,656 | A | 1/1998 | Goossen | 6,288,472 B1 | 9/2001 | Cabuz et al. |
| 5,726,480 | A | 3/1998 | Pister | 6,288,824 B1 | 9/2001 | Kastalsky et al. |
| 5,739,945 | A | 4/1998 | Tayebati | 6,295,154 B1 | 9/2001 | Laor et al. |
| 5,740,150 | A | 4/1998 | Uchimaru et al. | 6,297,072 B1 | 10/2001 | Tilmans et al. |
| 5,745,193 | A | 4/1998 | Urbanus et al. | 6,323,982 B1 | 11/2001 | Hornbeck |
| 5,745,281 | A | 4/1998 | Yi et al. | 6,324,192 B1 | 11/2001 | Tayebati |
| 5,751,469 | A | 5/1998 | Arney et al. | 6,327,071 B1 | 12/2001 | Kimura |
| 5,771,116 | A | 6/1998 | Miller et al. | 6,329,297 B1 | 12/2001 | Balish et al. |
| 5,771,321 | A | 6/1998 | Stern | 6,335,831 B2 | 1/2002 | Kowarz et al. |
| 5,784,189 | A | 7/1998 | Bozler et al. | 6,351,329 B1 | 2/2002 | Greywal |
| 5,784,190 | A | 7/1998 | Worley | 6,356,254 B1 | 3/2002 | Kimura |
| 5,784,212 | A | 7/1998 | Hornbeck | 6,358,021 B1 | 3/2002 | Cabuz |
| 5,786,927 | A | 7/1998 | Greywall | 6,359,673 B1 | 3/2002 | Stephenson |
| 5,793,504 | A | 8/1998 | Stoll | 6,376,787 B1 | 4/2002 | Martin et al. |
| 5,808,780 | A | 9/1998 | McDonald | 6,377,233 B2 | 4/2002 | Colgan et al. |
| 5,808,781 | A | 9/1998 | Arney et al. | 6,391,675 B1 | 5/2002 | Ehmke et al. |
| 5,818,095 | A | 10/1998 | Sampsell | 6,392,233 B1 | 5/2002 | Channin et al. |
| 5,822,110 | A | 10/1998 | Dabbaj | 6,392,781 B1 | 5/2002 | Kim et al. |
| 5,822,170 | A | 10/1998 | Cabuz et al. | 6,399,257 B1 | 6/2002 | Shirota et al. |
| 5,824,608 | A | 10/1998 | Gotoh et al. | 6,407,851 B1 | 6/2002 | Islam et al. |
| 5,825,528 | A | 10/1998 | Goosen | 6,433,917 B1 | 8/2002 | Mei et al. |
| 5,835,255 | A | 11/1998 | Miles | 6,446,486 B1 | 9/2002 | deBoer et al. |
| 5,842,088 | A | 11/1998 | Thompson | 6,447,126 B1 | 9/2002 | Hornbeck |
| 5,867,302 | A | 2/1999 | Fleming et al. | 6,448,622 B1 | 9/2002 | Franke et al. |
| 5,896,796 | A | 4/1999 | Chih | 6,449,084 B1 | 9/2002 | Guo |
| 5,912,758 | A | 6/1999 | Knipe et al. | 6,452,465 B1 | 9/2002 | Brown et al. |
| 5,914,803 | A | 6/1999 | Hwang et al. | 6,456,420 B1 | 9/2002 | Goodwin-Johansson |
| 5,920,421 | A | 7/1999 | Choi | 6,465,355 B1 | 10/2002 | Horsley |
| 5,926,309 | A | 7/1999 | Little | 6,466,354 B1 | 10/2002 | Gudeman |
| 5,943,155 | A | 8/1999 | Goossen | 6,466,358 B2 | 10/2002 | Tew |
| 5,943,158 | A | 8/1999 | Ford et al. | 6,473,072 B1 | 10/2002 | Comiskey et al. |
| 5,959,763 | A | 9/1999 | Bozler et al. | 6,473,274 B1 | 10/2002 | Maimone et al. |
| 5,967,163 | A | 10/1999 | Pan et al. | 6,480,177 B2 | 11/2002 | Doherty et al. |
| 5,972,193 | A | 10/1999 | Chou et al. | 6,496,122 B2 | 12/2002 | Sampsell |
| 5,976,902 | A | 11/1999 | Shih | 6,513,911 B1 | 2/2003 | Ozaki et al. |
| 5,978,127 | A | 11/1999 | Berg | 6,522,801 B1 | 2/2003 | Aksyuk et al. |
| 5,986,796 | A | 11/1999 | Miles et al. | 6,531,945 B1 | 3/2003 | Ahn et al. |
| 6,016,693 | A | 1/2000 | Viani et al. | 6,537,427 B1 | 3/2003 | Raina et al. |
| 6,028,690 | A | 2/2000 | Carter et al. | 6,545,335 B1 | 4/2003 | Chua et al. |
| 6,031,653 | A | 2/2000 | Wang | 6,548,908 B2 | 4/2003 | Chua et al. |
| 6,038,056 | A | 3/2000 | Florence et al. | 6,549,338 B1 | 4/2003 | Wolverton et al. |
| 6,040,937 | A | 3/2000 | Miles | 6,552,840 B2 | 4/2003 | Knipe |
| 6,049,317 | A | 4/2000 | Thompson et al. | 6,574,033 B1 | 6/2003 | Chui et al. |
| 6,055,090 | A | 4/2000 | Miles et al. | 6,577,785 B1 | 6/2003 | Spahn et al. |
| 6,057,903 | A | 5/2000 | Colgan et al. | 6,589,625 B1 | 7/2003 | Kothari et al. |
| 6,061,075 | A | 5/2000 | Nelson et al. | 6,597,490 B2 | 7/2003 | Tayebati |
| 6,097,145 | A | 8/2000 | Kastalsky et al. | 6,600,201 B2 | 7/2003 | Hartwell et al. |

| | | | | | |
|---|---|---|---|---|---|
| 6,606,175 B1 | 8/2003 | Sampsell et al. | 2002/0003400 A1 | 1/2002 | Lee |
| 6,608,268 B1 | 8/2003 | Goldsmith | 2002/0014579 A1 | 2/2002 | Dunfield |
| 6,610,440 B1 | 8/2003 | LaFollette et al. | 2002/0015215 A1 | 2/2002 | Miles |
| 6,618,187 B2 | 9/2003 | Pilossof | 2002/0021485 A1 | 2/2002 | Pilossof |
| 6,625,047 B2 | 9/2003 | Coleman, Jr. | 2002/0024711 A1 | 2/2002 | Miles |
| 6,630,786 B2 | 10/2003 | Cummings et al. | 2002/0027636 A1 | 3/2002 | Yamada |
| 6,632,698 B2 | 10/2003 | Ives | 2002/0031155 A1 | 3/2002 | Tayebati et al. |
| 6,635,919 B1 | 10/2003 | Melendez et al. | 2002/0036304 A1 | 3/2002 | Ehmke et al. |
| 6,642,913 B1 | 11/2003 | Kimura et al. | 2002/0054422 A1 | 5/2002 | Carr et al. |
| 6,643,069 B2 | 11/2003 | Dewald | 2002/0054424 A1 | 5/2002 | Miles |
| 6,650,455 B2 | 11/2003 | Miles | 2002/0055253 A1 | 5/2002 | Rudhard |
| 6,653,997 B2 | 11/2003 | Van Gorkom et al. | 2002/0071169 A1 | 6/2002 | Bowers et al. |
| 6,657,832 B2 | 12/2003 | Williams et al. | 2002/0075555 A1 | 6/2002 | Miles |
| 6,666,561 B1 | 12/2003 | Blakley | 2002/0086455 A1 | 7/2002 | Franosch et al. |
| 6,674,090 B1 | 1/2004 | Chua et al. | 2002/0109899 A1 | 8/2002 | Ohtaka et al. |
| 6,674,562 B1 | 1/2004 | Miles | 2002/0110948 A1 | 8/2002 | Huang et al. |
| 6,674,563 B2 | 1/2004 | Chui et al. | 2002/0117728 A1 | 8/2002 | Brosnihan et al. |
| 6,680,792 B2 | 1/2004 | Miles | 2002/0126364 A1 | 9/2002 | Miles |
| 6,704,475 B2 | 3/2004 | Jin et al. | 2002/0131682 A1 | 9/2002 | Nasiri et al. |
| 6,710,908 B2 | 3/2004 | Miles et al. | 2002/0135857 A1 | 9/2002 | Fitzpatrick et al. |
| 6,713,235 B1 | 3/2004 | Ide et al. | 2002/0137072 A1 | 9/2002 | Mirkin et al. |
| 6,720,267 B1 | 4/2004 | Chen et al. | 2002/0141690 A1 | 10/2002 | Jin et al. |
| 6,736,987 B1 | 5/2004 | Cho | 2002/0149828 A1 | 10/2002 | Miles |
| 6,741,377 B2 | 5/2004 | Miles | 2002/0149850 A1 | 10/2002 | Heffner et al. |
| 6,741,384 B1 | 5/2004 | Martin et al. | 2002/0164879 A1* | 11/2002 | Leung et al. ................ 438/706 |
| 6,741,503 B1 | 5/2004 | Farris et al. | 2002/0168136 A1 | 11/2002 | Atia et al. |
| 6,743,570 B2 | 6/2004 | Harnett et al. | 2002/0195681 A1 | 12/2002 | Melendez et al. |
| 6,747,785 B2 | 6/2004 | Chen et al. | 2003/0006468 A1 | 1/2003 | Ma et al. |
| 6,747,800 B1 | 6/2004 | Lin | 2003/0029705 A1 | 2/2003 | Qiu et al. |
| 6,756,317 B2 | 6/2004 | Sniegowski et al. | 2003/0043157 A1 | 3/2003 | Miles |
| 6,768,097 B1 | 7/2004 | Viktorovitch et al. | 2003/0053078 A1 | 3/2003 | Missey et al. |
| 6,775,174 B2 | 8/2004 | Huffman et al. | 2003/0054588 A1 | 3/2003 | Patel et al. |
| 6,778,155 B2 | 8/2004 | Doherty et al. | 2003/0062186 A1 | 4/2003 | Boroson et al. |
| 6,778,306 B2 | 8/2004 | Sniegowski et al. | 2003/0072070 A1 | 4/2003 | Miles |
| 6,794,119 B2 | 9/2004 | Miles | 2003/0090350 A1 | 5/2003 | Feng et al. |
| 6,803,534 B1 | 10/2004 | Chen et al. | 2003/0091072 A1 | 5/2003 | Wang et al. |
| 6,811,267 B1 | 11/2004 | Allen et al. | 2003/0112096 A1 | 6/2003 | Potter |
| 6,812,482 B2 | 11/2004 | Fleming et al. | 2003/0123126 A1 | 7/2003 | Meyer et al. |
| 6,819,469 B1 | 11/2004 | Koba | 2003/0138213 A1 | 7/2003 | Jiin et al. |
| 6,822,628 B2 | 11/2004 | Dunphy et al. | 2003/0164350 A1 | 9/2003 | Hanson et al. |
| 6,829,132 B2 | 12/2004 | Martin et al. | 2003/0201784 A1 | 10/2003 | Potter |
| 6,853,129 B1 | 2/2005 | Cummings et al. | 2003/0202264 A1 | 10/2003 | Weber et al. |
| 6,855,610 B2 | 2/2005 | Tung et al. | 2003/0202265 A1 | 10/2003 | Reboa et al. |
| 6,859,218 B1 | 2/2005 | Luman et al. | 2003/0202266 A1 | 10/2003 | Ring et al. |
| 6,861,277 B1 | 3/2005 | Monroe et al. | 2003/0210851 A1 | 11/2003 | Fu et al. |
| 6,862,022 B2 | 3/2005 | Slupe | 2003/0231373 A1 | 12/2003 | Kowarz et al. |
| 6,862,029 B1 | 3/2005 | D'Souza et al. | 2004/0010115 A1 | 1/2004 | Sotzing |
| 6,867,896 B2 | 3/2005 | Miles | 2004/0027636 A1 | 2/2004 | Miles |
| 6,870,581 B2 | 3/2005 | Li et al. | 2004/0027701 A1 | 2/2004 | Ishikawa |
| 6,870,654 B2 | 3/2005 | Lin et al. | 2004/0028849 A1 | 2/2004 | Stark et al. |
| 6,882,458 B2 | 4/2005 | Lin et al. | 2004/0035821 A1 | 2/2004 | Doan et al. |
| 6,882,461 B1 | 4/2005 | Tsai et al. | 2004/0051929 A1 | 3/2004 | Sampsell et al. |
| 6,905,621 B2 | 6/2005 | Ho et al. | 2004/0053434 A1 | 3/2004 | Bruner |
| 6,912,022 B2 | 6/2005 | Lin et al. | 2004/0056742 A1 | 3/2004 | Dabbaj |
| 6,940,631 B2 | 9/2005 | Ishikawa | 2004/0058531 A1 | 3/2004 | Miles et al. |
| 6,952,303 B2 | 10/2005 | Lin et al. | 2004/0058532 A1 | 3/2004 | Miles et al. |
| 6,952,304 B2 | 10/2005 | Mushika et al. | 2004/0061543 A1 | 4/2004 | Nam et al. |
| 6,958,847 B2 | 10/2005 | Lin | 2004/0063322 A1 | 4/2004 | Yang |
| 6,980,350 B2 | 12/2005 | Hung et al. | 2004/0080807 A1 | 4/2004 | Chen et al. |
| 6,982,820 B2 | 1/2006 | Tsai | 2004/0080832 A1 | 4/2004 | Singh |
| 6,995,890 B2 | 2/2006 | Lin | 2004/0087086 A1 | 5/2004 | Lee |
| 6,999,225 B2 | 2/2006 | Lin | 2004/0100677 A1 | 5/2004 | Huibers et al. |
| 6,999,236 B2 | 2/2006 | Lin | 2004/0124073 A1 | 7/2004 | Pilans et al. |
| 7,008,812 B1* | 3/2006 | Carley ................ 438/52 | 2004/0125281 A1 | 7/2004 | Lin et al. |
| 7,042,643 B2 | 5/2006 | Miles et al. | 2004/0125282 A1 | 7/2004 | Lin et al. |
| 7,110,158 B2 | 9/2006 | Miles | 2004/0125536 A1 | 7/2004 | Arney et al. |
| 2001/0003487 A1 | 6/2001 | Miles | 2004/0136076 A1 | 7/2004 | Tayebati |
| 2001/0010953 A1 | 8/2001 | Kang et al. | 2004/0145049 A1 | 7/2004 | McKinnell et al. |
| 2001/0026951 A1 | 10/2001 | Vergani et al. | 2004/0145811 A1 | 7/2004 | Lin et al. |
| 2001/0028503 A1 | 10/2001 | Flanders et al. | 2004/0147056 A1 | 7/2004 | McKinnell et al. |
| 2001/0040649 A1 | 11/2001 | Ozaki | 2004/0147198 A1 | 7/2004 | Lin et al. |
| 2001/0040675 A1 | 11/2001 | True et al. | 2004/0148009 A1 | 7/2004 | Buzzard |
| 2001/0055208 A1 | 12/2001 | Kimura | 2004/0150869 A1 | 8/2004 | Kasai |

| | | |
|---|---|---|
| 2004/0160143 A1 | 8/2004 | Shreeve et al. |
| 2004/0174583 A1 | 9/2004 | Chen et al. |
| 2004/0175577 A1 | 9/2004 | Lin et al. |
| 2004/0179281 A1 | 9/2004 | Reboa |
| 2004/0179445 A1 | 9/2004 | Park |
| 2004/0191937 A1 | 9/2004 | Patel et al. |
| 2004/0207897 A1 | 10/2004 | Lin |
| 2004/0209192 A1 | 10/2004 | Lin et al. |
| 2004/0209195 A1 | 10/2004 | Lin |
| 2004/0212026 A1 | 10/2004 | Van Brocklin et al. |
| 2004/0217378 A1 | 11/2004 | Martin et al. |
| 2004/0217919 A1 | 11/2004 | Pichl et al. |
| 2004/0218251 A1 | 11/2004 | Piehl et al. |
| 2004/0218334 A1 | 11/2004 | Martin et al. |
| 2004/0218341 A1 | 11/2004 | Martin et al. |
| 2004/0227493 A1 | 11/2004 | Van Brocklin et al. |
| 2004/0240027 A1 | 12/2004 | Lin et al. |
| 2004/0240032 A1 | 12/2004 | Miles |
| 2004/0240138 A1 | 12/2004 | Martin et al. |
| 2004/0245588 A1 | 12/2004 | Nikkel et al. |
| 2004/0263944 A1 | 12/2004 | Miles et al. |
| 2005/0001828 A1 | 1/2005 | Martin et al. |
| 2005/0003667 A1 | 1/2005 | Lin et al. |
| 2005/0020089 A1 | 1/2005 | Shi et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0036192 A1 | 2/2005 | Lin et al. |
| 2005/0038950 A1 | 2/2005 | Adelmann |
| 2005/0042117 A1 | 2/2005 | Lin |
| 2005/0046922 A1 | 3/2005 | Lin et al. |
| 2005/0046948 A1 | 3/2005 | Lin |
| 2005/0057442 A1 | 3/2005 | Way |
| 2005/0068583 A1 | 3/2005 | Gutkowski et al. |
| 2005/0068605 A1 | 3/2005 | Tsai |
| 2005/0068606 A1 | 3/2005 | Tsai |
| 2005/0069209 A1 | 3/2005 | Damera-Venkata et al. |
| 2005/0078348 A1 | 4/2005 | Lin |
| 2005/0142684 A1 | 6/2005 | Miles |
| 2005/0168849 A1 | 8/2005 | Lin |
| 2005/0195462 A1 | 9/2005 | Lin |
| 2005/0195467 A1 | 9/2005 | Kothari et al. |
| 2005/0202649 A1 | 9/2005 | Hung et al. |
| 2006/0066932 A1 | 3/2006 | Chui |
| 2008/0130089 A1 | 6/2008 | Miles |

FOREIGN PATENT DOCUMENTS

| | | |
|---|---|---|
| CH | 681 047 | 12/1992 |
| CN | 092109265 | 4/2003 |
| DE | 199 38 072 | 3/2000 |
| DE | 10228946 | 1/2004 |
| EP | 0 035 299 | 9/1983 |
| EP | 0 173 808 | 3/1986 |
| EP | 0 667 548 | 8/1995 |
| EP | 0 694 801 | 1/1996 |
| EP | 0 695 959 | 2/1996 |
| EP | 0 788 005 | 8/1997 |
| EP | 0 878 824 | 11/1998 |
| EP | 1 170 618 | 1/2002 |
| EP | 1 197 778 | 4/2002 |
| EP | 1 258 860 | 11/2002 |
| EP | 1 452 481 | 9/2004 |
| FR | 2824643 | 10/1999 |
| JP | 49-004993 | 1/1974 |
| JP | 05275401 | 10/1993 |
| JP | 06301054 | 10/1994 |
| JP | 07-014985 | 1/1995 |
| JP | 08293580 | 11/1996 |
| JP | 9-127439 | 5/1997 |
| JP | 10-500224 | 1/1998 |
| JP | 10-148644 | 6/1998 |
| JP | 10-267658 | 10/1998 |
| JP | 11211999 A | 8/1999 |
| JP | 11-243214 | 9/1999 |
| JP | 2000-040831 | 2/2000 |
| JP | 2002-270575 | 9/2000 |
| JP | 2001-085519 | 3/2001 |
| JP | 2002-287047 | 3/2001 |
| JP | 2002 062493 | 2/2002 |
| JP | 2002-355800 | 12/2002 |
| JP | 2003-001598 | 1/2003 |
| JP | 2004-102022 | 4/2004 |
| JP | 2004-106074 | 4/2004 |
| JP | 2004-212656 | 7/2004 |
| JP | 2005-051007 | 2/2005 |
| KR | 157313 | 5/1991 |
| KR | 2002-9270 | 10/1999 |
| KR | 2000-0033006 | 6/2000 |
| WO | WO 91/05284 | 4/1991 |
| WO | WO 92/10925 | 6/1992 |
| WO | WO 95/30924 | 11/1995 |
| WO | WO 97/17628 | 5/1997 |
| WO | WO 99/52006 | 10/1999 |
| WO | WO 99/52006 A3 | 10/1999 |
| WO | WO 01/14248 | 3/2001 |
| WO | WO 01/63657 | 8/2001 |
| WO | WO 02/24570 | 3/2002 |
| WO | WO 02/38491 | 5/2002 |
| WO | WO 03/007049 | 1/2003 |
| WO | WO 03/052506 | 6/2003 |
| WO | WO 03/069413 | 8/2003 |
| WO | WO 03/073151 | 9/2003 |
| WO | WO 2004/006003 | 1/2004 |
| WO | WO 2004/026757 | 4/2004 |
| WO | WO 2005/019899 | 3/2005 |
| WO | WO 2005/085932 | 9/2005 |
| WO | WO 2006/036385 | 4/2006 |
| WO | WO 2006/036437 | 4/2006 |
| WO | WO 2006/036542 | 4/2006 |

OTHER PUBLICATIONS

Aratani et al., "Process and Design Considerations for Surface Micromachined Beams for a Tuneable interferometer Array in Silicon," Proc. IEEE Microelectromechanical Workshop, Fort Lauderdale, FL, pp. 230-235 (Feb. 1993).

Aratani K. et al. "Surface Micromachined Tuneable Interferometer Array," Sensors and Actuators A, Elsevier Sequoia S.A., Lausanne, CH, vol. A43, No. 1/3, May 1, 1994, pp. 17-23.

Goossen et al., "Possible Display Applications of the Silicon Mechanical Anti-Reflection Switch," Society for Information Display (1994).

Ibbotson et al., "Comparison of XeF2 and F-atom reactions with Si and SiO2," Applied Physics Letters, vol. 44, No. 12, pp. 1129-1131 (Jun. 1984).

Joannopoulos et al., "Photonic Crystals: Molding the Flow of Light," Princeton University Press (1995).

Lin et al., "Free-Space Micromachined Optical Switches for Optical Networking," IEEE Journal of Selected Topics in Quantum Electronics, vol. 5, No. 1, pp. 4-9. (Jan./Feb. 1999).

Magel, "Integrated Optic Devices Using Micromachined Metal Membranes," SPIE vol. 2686, 0-8194-2060-(Mar. 1996).

Raley et al., "A Fabry-Perot Microinterferometer for Visible Wavelengths," IEEE Solid-State Sensor and Actuator Workshop, Hilton Head, SC, pp. 170-173 (1992).

Sridharan et al. "Post-packaging Release a New Concept for Surface-Micromachined Devices" Technical Digest, IEEE Solid-State Sensor & Actuator Workshop, New York, NY US Nov. 8, 1998 (pp. 225-228).

Williams, et al. Etch Rates for Micromachining Processing. Journal of Microelectromechanical Systems, vol. 5, No. 4, pp. 256-259, (Dec. 1996).

Winters, et al. The etching of silicon with XeF2 vapor. Applied Physics Letters, vol. 34, No. 1, pp. 70-73, (Jan. 1979).

Chiou et al., "A Novel Capacitance Control Design of Tunable Capacitor Using Multiple Electrostatic Driving Electrodes," IEEE NANO 2001, M 3.1, Nanoelectronics and Giga-Scale Systems (Special Session), Oct. 29, 2001, pp. 319-324.
Fork, et al., "P-67: Chip on Glass Bonding using StressedMetal™ Technology" Sid 05 Digest, May 24, 2005.
Kawamura et al., Fabrication of fine metal microstructures packaged in the bonded glass substrates, Proceedings of SPIE, vol. 3893, pp. 486-493, 1999.
Yao et al., BrF3 dry release technology for large freestanding parylene microstructures and electrostatic actuators, Sensors and Actuators A, vol. 97-98, pp. 771-775, Apr. 2002.
Office Action dated Jun. 18, 2003 in U.S. Appl. No. 10/074,562.
Office Action dated Jun. 21, 2006 in U.S. Appl. No. 10/941,042.
Office Action dated Apr. 20, 2005 in U.S. Appl. No. 10/941,042.
First Office Action in Chinese App. No. 02828414.3, dated Mar. 17, 2006.
Office Action in European App. No. 02725847.4, dated Jan. 4, 2007.
Office Action in European App. No. 02725847.4, dated Aug. 6, 2007.
Supplemental Search Report in European App. No. 02725847.4, dated Aug. 14, 2006.
Office Action dated Apr. 10, 2006 in Japanese App. No. 2003-568475.
Office Action dated Nov. 13, 2006 in Japanese App. No. 2003-568475.
Office Action dated Apr. 3, 2007 in Japanese App. No. 2003-568475.
WO for PCT/US02/13442 filed Apr. 29, 2002.
IPER for PCT/US02/13442 filed Apr. 29, 2002.
Bains, "Digital Paper Display Technology Holds Promise For Portables," CommsDesign EE Times (2000).
Bass, Handbook of Optics, vol. 1, Fundamentals, Techniques, and Design, Second Edition, McGraw-Hill, inc. New York pp. 2.29/2.36 (1995).
Chu, et al. "Formation and Microstructures of Anodic Aluminoa Films from Aluminum Sputtered onglass Substrate" Journal of the Electrochemical Society, 149 (7) B321-B327 (2002).
Conner, "Hybrid Color Display Using Optical Interference Filter Array," SID Digest, pp. 557-580 (1993).
Crouse, "Self-ordered pore structure of anodized aluminum on silicon and pattern transfer" Applied Physics Letters, vol. 76, No. 1, Jan. 3, 2000. pp. 49-51.
Fan et al., "Channel Drop Filters in Photonic Crystals," Optics Express, vol. 3, No. 1 (1998).
French, P.J. "Development of Surface Micromachining techniques compatable with on-chip electronics" Journal of Micromechanics and Microengineering vol. 6 No. 2, 197-211 XP 002360789 Jun. (1996) IOP Publishing.
Furneaux, et al. "The Formation of Controlled-porosity membranes from Anodically Oxidized Aluminium" Nature vo 337 Jan. 12, 1989, pp. 147-149.
Giles et al., "A Silicon MEMS Optical Switch Attenuator and Its e in Lightwave Subsystems," IEEE Journal of Selected Topics in Quanum Electronics, vol. 5, No. 1, pp. 18-25, (Jan./Feb. 1999).
Goossen et al., "Silicon Modulator Based on Mechanically-Active Anti-Reflection Layer with 1Mbit/sec Capability for Fiber-in-the-Loop Applications," IEEE Photonics Technology Letters, pp. 1119-1121 (Sep. 1994).
Goossen K.W., "MEMS-Based Variable Optical Interference Devices", Optical MEMS, 2000 IEEE/Leos International Conference on Aug. 21-24, 2000, Piscataway, NJ, USA, IEE, Aug. 21, 2000, pp. 17-18.
Gosch, "West Germany Grabs the Lead in X-Ray Lithography," Electronics, pp. 78-80 (Feb. 5, 1987).
Harnett et al. Heat-Depolymerizable polycarbonates as electron beam patternable sacrificial layers for nanofluidics J. Vax. Sci. Technol. B. 19 (6) Nov./Dec. 2001 pp. 2842-2845.
Howard et al., "Nanometer-Scale Fabrication Techniques," VLSI Electronics: Microstructure Science, vol. 5, pp. 145-153, and pp. 166-173 (1982).
Jackson, "Classical Electrodynamics," John Wiley & Sons Inc., pp. 568-573 (date unknown).
Jerman J. H. et al., "Miniature Fabry-Perot Interferometers Micromachined in Silicon for Use in Optical Fiber WDM Systems," Transducers. San Francisco, Jun. 24-27, 1991, Proceedings of the Internatioal Conference on Solid State Sensors Andactuators, New Youk IEEE, US, vol. Conf. 6, Jun. 24, 1991.
Jerman et al., "A Miniature Fabry-Perot Interferometer Fabricated Using Silicon Micromaching Techniques," IEEE Electron Devices Society (1998).
Johnson, "Optical Scanners," Microwave Scanning Antennas, vol. 1, pp. 251-261 (1964).
Kim et al., "Control of Optical Transmission Through Metals Perforated With Subwavelength Hole Arrays," Optic Letters, vol. 24, No. 4, pp. 256-258 (Feb. 1999).
Lee, et al. "Electrostatic Actuation of Surface/Bulk Micro machines Single-Crystal Silicon Microresonators" International Conference onIntelligent Robots and Systems, vol. 2 pp. 1057-1062 (Oct. 17-21, 1999).
Lee, Et al. The Surface/Bulk Micromachining (SBM) Process: A New Method for Fabricating Released Mems in Sinlge.
Lieberman, "Microbridges at Heart of New MEMS Displays," EE Times (Apr. 24, 1997).
Lieberman, "MEMS Display Looks to Give PDAs Sharper Image," EE Times (Feb. 11, 1997).
Light over Matter, Circle No. 36 (Jun. 1993).
Little et al., "Vertically Coupled Microring Resonator Channel Dropping Filter," IEEE Photonics Technology Letters, vol. 11, No. 2, (1999).
Maboudian, et al. Critical Review: Adhesion in Surface Micromechanical Structures: J. Vac. Sci Techno. B 15(1) Jan./Feb. 1997, pp. 1-20.
Microchem, LOR Lift-Off Resists Datasheet, 2002.
Miles, "A New Reflective FPD Technology Using lnterferometric Modulation," The Proceedings of the Society for Information Display (May 11-16, 1997).
Miles, et al., "10.1: Digital Paper for Reflective Displays," 2002 SID International Symposium Digest of Technical Papers, Boston, MA, SID International Symposium Digest of Technical Papers, San Jose, CA, vol. 33 / 1, pp. 115-117 (May 21-23, 2002).
Miles, "Interferometric Modulation: MOEMS as an Enabling Technology for High-Performance Reflective Displays," Proceedings of the International Society for Optical Engineering, San Jose, CA, vol. 49085, pp. 131-139 (Jan. 28, 2003).
Nagami et al., "Plastic Cell Architecture: Towards Reconfigurable Computing For General-Purpose," IEEE, 0-8186-8900-, pp. 68-77, (May 1998).
Newsbreaks, "Quantum-trench devices might operate at terahertz frequencies,".
Oliner, "Radiating Elements and Mutual Coupling," Microwave Scanning Antennas, vol. 2, 131-157 and pp. 190-194 (1966).
Penta Vacuum MEMS Etcher Specifications, HTTP—WWW.PENTAVACUUM.COM-MEMES.HTM.
Schnakenberg, et al. TMAHW Etchants for Silicon Micromachining. 1991 International Conference on Solid State Sensors and Actuators-Digest of Technical Papers. pp. 815-818.
Science and Technology, The Economist, pp. 89-90, (May 1999).
Sperger et al., "High Performance Patterned All-Dielectric Interference Colour Filter for Display Applications," SID Digest, pp. 81-83 (1994).
Stone, "Radiation and Optics, An Introduction to the Classical Theory," McGraw-Hill, pp. 340-343 (1963).
Tayebi et al. "Reducing the Effects of adhesion and friction in microelectomechanical systesm (MEMS) through surface roughening: Comparision Between theory and experiments" http://jap.ajp.org/jap/copyright.isp Journal of applied Physics 98, 073528 (2005).
Thin Film Transistors- Materials and Processes -vol. 1 Amorphous Silicon Thin Film Transistors ed. Yue Kuo, Kluwer Academic Publishers, Boston (2004).
Walker et al., "Electron-beam-tunable Interference Filter Spatial Light Modulator," Optics Letters vol. 13, No. 5, pp. 345-347 (May 1988).
Winton, John M., "A novel way to capture solar energy," Chemical Week, pp. 17-18 (May 15, 1985).
Wu et al., "Design of a Reflective Color LCD Using Optical Interference Reflectors," ASIA Display '95, pp. 929-931 (Oct. 16, 1995).
Xactix Xetch Product Information.

Xactix Xetch X# Specifications, http:—www.xactix.com-Xtech X3specs.htm, Jan. 5, 2005.
Zhou et al., "Waveguide Panel Display ing Electromechanical Spatial Modulators" SID Digest, vol. XXIX, (1998).
Austrian SR dated May 4, 2005.
Austrian SR dated May 13, 2005.
Austrian SR dated May 18, 2005.
Austrian SR dated Jul. 6, 2005.
Austrian SR dated Jul. 27, 2005.
Austrian SR dated Aug. 12, 2005.
Austrialian Search Report Aug. 11, 2005.
ISR for PCT/US96/17731.
ISR and WO for PCT/US04/035820 filed Oct. 28, 2004.
ISR and WO for PCT/US05/032647 filed Sep. 15, 2005.
ISR and WO for PCT/US05/031693 filed Sep. 2, 2005.
Invitation to Pay Additional Fees for PCT/US05/033558 filed Sep. 18, 2005.
ISR for and WO for PCT/US05/33558 filed Sep. 19, 2005.
ISR and WO for PCT/US05/029821 filed Aug. 22, 2005.
Invitation to Pay Additional Fees for PCT/US05/032331, filed Sep. 9, 2005.
ISR for PCT/US05/032331 Filed Sep. 9, 2005.
European Search Report 05255661.0 mailed Dec. 30, 2005.
ISR and WO for PCT/US05/030033 filed Aug. 23, 2005.
ISR for PCT/US05/030927 filed Aug. 30, 2005.
ISR and WO for PCT/US05/030902 filed Aug. 30, 2005.
ISR and WO for PCT/US04/20330 filed Jun. 23, 2004.
Notice of Grounds for Rejection dated Nov. 17, 2008 in Korean App. No. 2004-7012516.

* cited by examiner

US 7,642,110 B2

METHOD FOR FABRICATING A STRUCTURE FOR A MICROELECTROMECHANICAL SYSTEMS (MEMS) DEVICE

CROSS-REFERENCE TO RELATED APPLICATIONS

This application is a continuation of U.S. patent application Ser. No. 10/941,042, filed Sep. 14, 2004, now published as U.S. Patent Publication No. 2005/0142684, which is a continuation of U.S. patent application Ser. No. 10/074,562, filed Feb. 12, 2002, now issued as U.S. Pat. No. 6,794,119, the disclosures of each of which are hereby incorporated by reference in their entirety.

FIELD OF THE INVENTION

This invention relates to microfabrication. In particular, it relates to the microfabrication of a structure for a Microelectromechanical Systems (MEMS) device.

BACKGROUND

Microfabrication techniques used to fabricate MEMS devices generally involve the deposition of one or more layers on a substrate and the subsequent patterning of the layers to produce useful structures. One technique for patterning a layer involves the use of photolithography. With photolithography a photographic definition of a desired pattern on a photo or optical mask is used to impart the pattern onto a surface of the layer. When manufacturing a MEMS device usually several masking steps are required, each masking step adding to the cost of the device. Accordingly, it is desirable to reduce the number of masking steps required during fabrication of a MEMS device.

SUMMARY OF THE INVENTION

According to one aspect of the invention there is provided a microfabrication process comprising depositing a first layer on a substrate; patterning the first layer; depositing a second layer on the first layer; and patterning the second layer using the first layer as a photomask.

DETAILED DESCRIPTION OF THE PREFERRED EMBODIMENT

Aspects of the present invention will now be described with reference to FIGS. 2 to 10 of the drawings which show the stages during fabrication of a MEMS device such as a Visible Spectrum Modulator Array described in U.S. Pat. No. 5,835,255 or an Interferometric Modulator (IMOD) described in U.S. Pat. No. 6,040,937. Naturally, describing the present invention with reference to stages in the manufacture of a Visible Spectrum Modulator Array or an IMOD is intended to enhance understanding of the present invention and it is to be understood that the present invention may used in the manufacture of other MEMS devices. Thus, the description of the present invention with reference to the manufacture of a Visible Spectrum Modulator Array or an IMOD is intended to be non-limiting.

Figure 1:
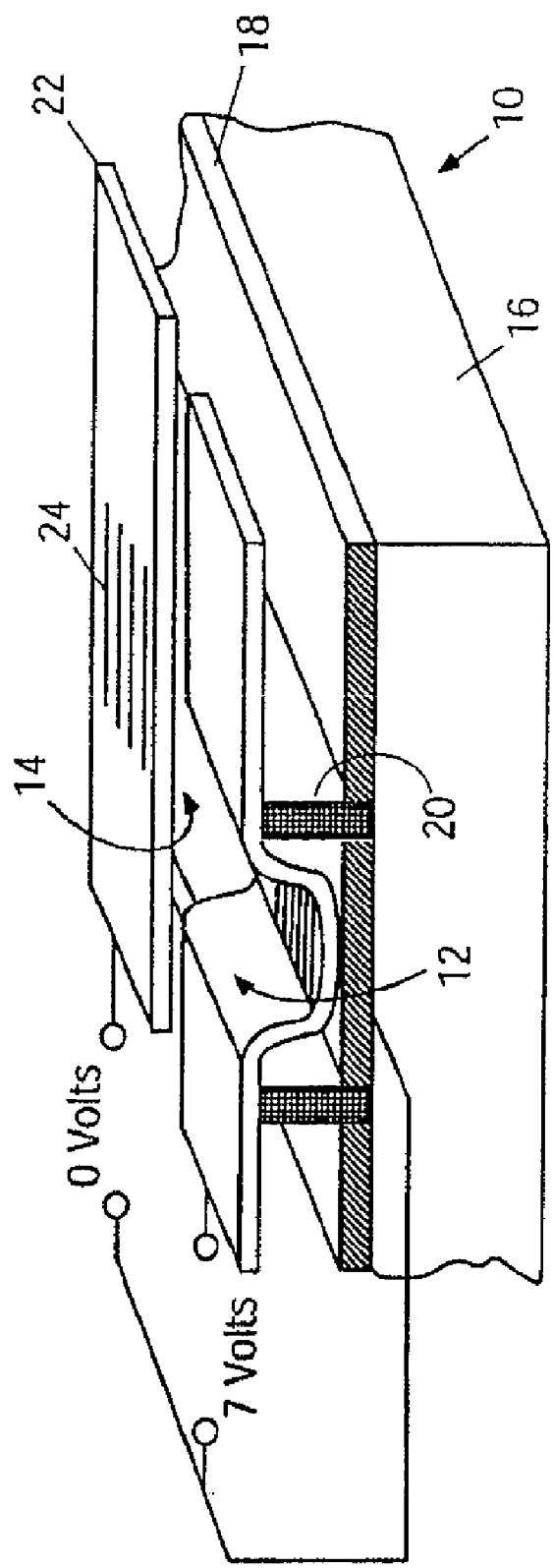
FIG. 1 shows a three dimensional drawing of a part of a MEMS device which may be manufactured using the microfabrication process of the present invention.

FIG. 1 of the drawings shows an example of a part of a Visible Spectrum Modulator Array 10 which may be fabricated in accordance with techniques described herein. Referring to FIG. 1, an antenna array is fabricated on one-half of a microfabricated interferometric cavity which transmits and reflects certain portions of incident electromagnetic radiation depending on (a) the dimensions of the cavity itself and (b) the frequency of response of dielectric mirrors in the cavities. In FIG. 1, the array 10 is shown to include two cavities 12, 14 fabricated on a transparent substrate 16. A layer 18, the primary mirror/conductor may comprise a combination of one or more films of metals, oxides, semiconductors, and transparent conductors. Insulating supports 20 hold up a second transparent conducting membrane 22. Each array element has an antenna array 24 formed on the membrane 22. The two structures 22, 24, together comprise the secondary mirror/conductor. Conversely, the antenna array may be fabricated as part of the primary mirror/conductor. Secondary, mirror/conductor 22/24 forms a flexible membrane, fabricated such that it is under tensile stress and thus parallel to the substrate, in an undriven state.

Because layers 22 and 24 are parallel, radiation which enters any of the cavities from above or below the array can undergo multiple reflections within the cavity, resulting in optical interference. Depending on the dimensions of the antenna array, the interference will determine its reflective and/or transmissive characteristics. Changing one of the dimensions, in this case the cavity height (i.e. the spacing between the inner walls of layers 18, 22), will alter the optical characteristics. The change in height is achieved by applying a voltage across the two layers of the cavity, which due to electrostatic forces, causes layer 22 to collapse. Cavity 12 is shown collapsed (7 volts applied), while cavity 14 is shown uncollapsed (0 volts applied).

Figure 2:
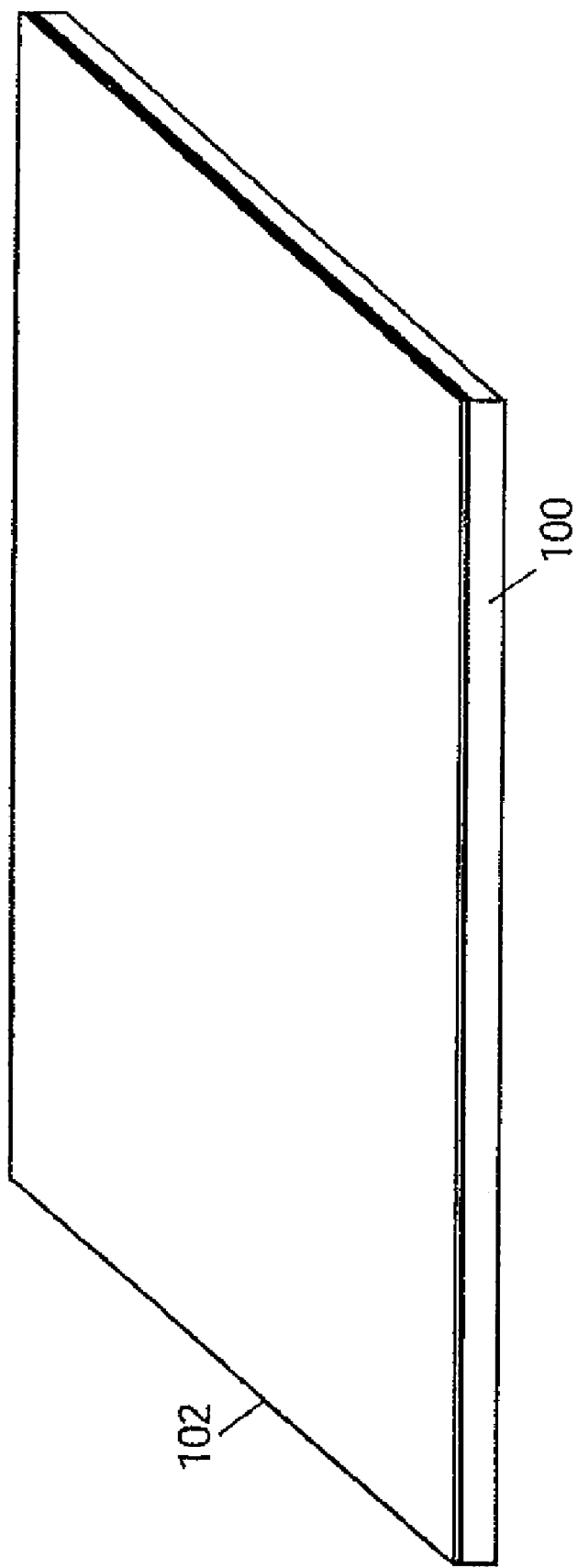
FIGS. 2 to 10 show various stages in the manufacture of the MEMS device of FIG. 1.

In fabricating the array 10, it is desirable that insulating supports 20 are well defined in regions where contact is made between insulating supports 20 and layers 18, 22. The present invention is especially useful in manufacturing such a support. FIGS. 2 through 10 show various stages in the manufacture of a MEMS device having supports such as the supports 20. Referring to FIG. 2 of the drawings, reference numeral 100 indicates a substrate 100. The substrate 100 may be of many different materials each being transparent to ultraviolet light. Examples of these materials include plastic, mylar, or quartz. The material must be able to support an optically smooth, though not necessarily flat, finish. A preferred material would likely be glass, which would be both transmissive and reflective operation in the visible range.

Various layers are deposited on substrate 100 to define a stack. In particular, the substrate 100 is coated with a sacrificial layer 102 using standard techniques such as a physical vapor deposition (PVD) method such as sputtering or e-beam evaporation. Other possible methods include chemical vapor deposition and molecular beam epitaxy.

In FIG. 2, the sacrificial layer is a single layer. However, in other embodiments of the invention layer 102 may be a stack of layers with an uppermost sacrificial layer.

Figure 3:
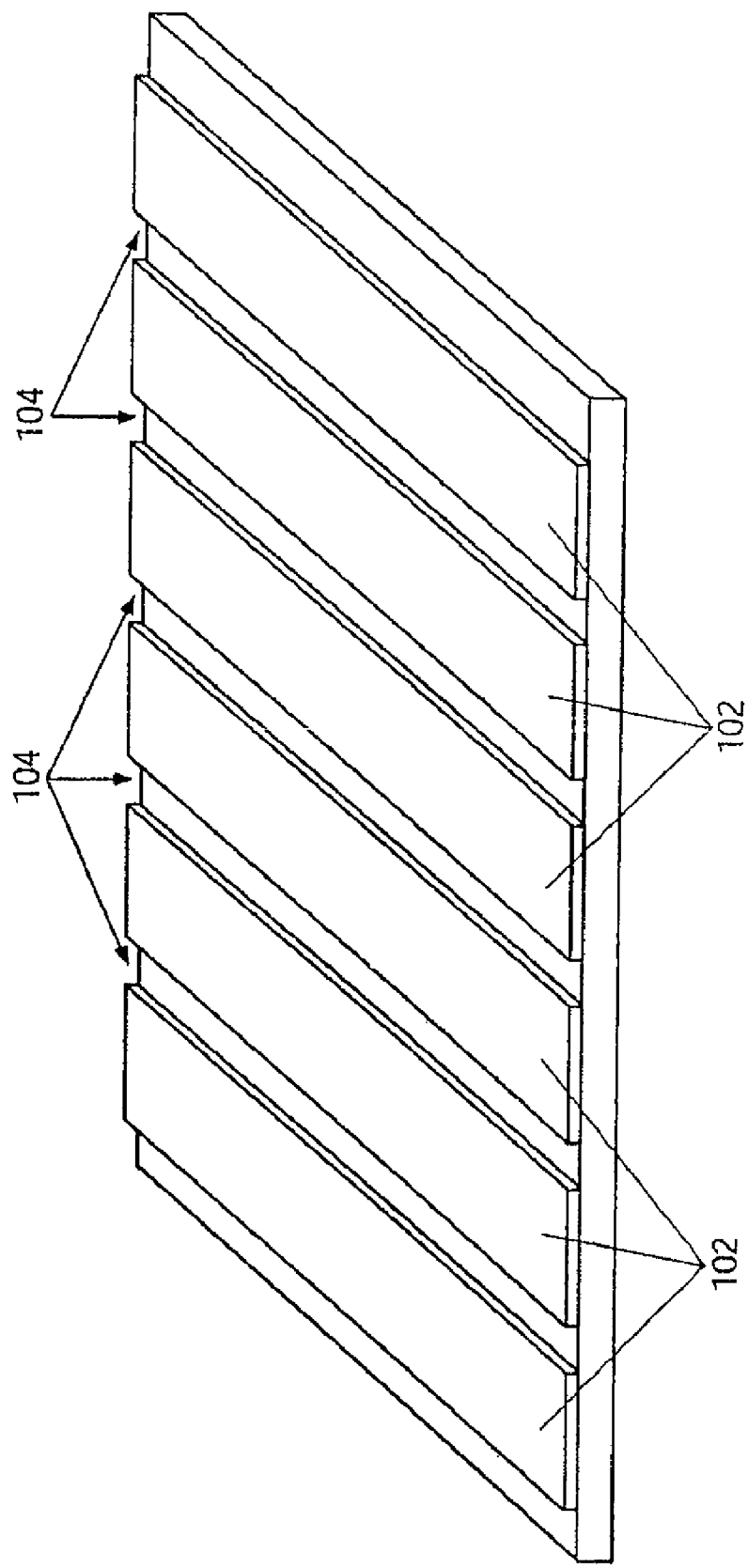

FIG. 3 of the drawings shows a stage in the manufacture of the MEMS device wherein the sacrificial layer 102 has been patterned so as to define longitudinally spaced grooves 104. A standard procedure is used to pattern sacrificial layer 102 which includes exposing layer 102 through an appropriate mask and developing to produce the pattern.

Figure 4:
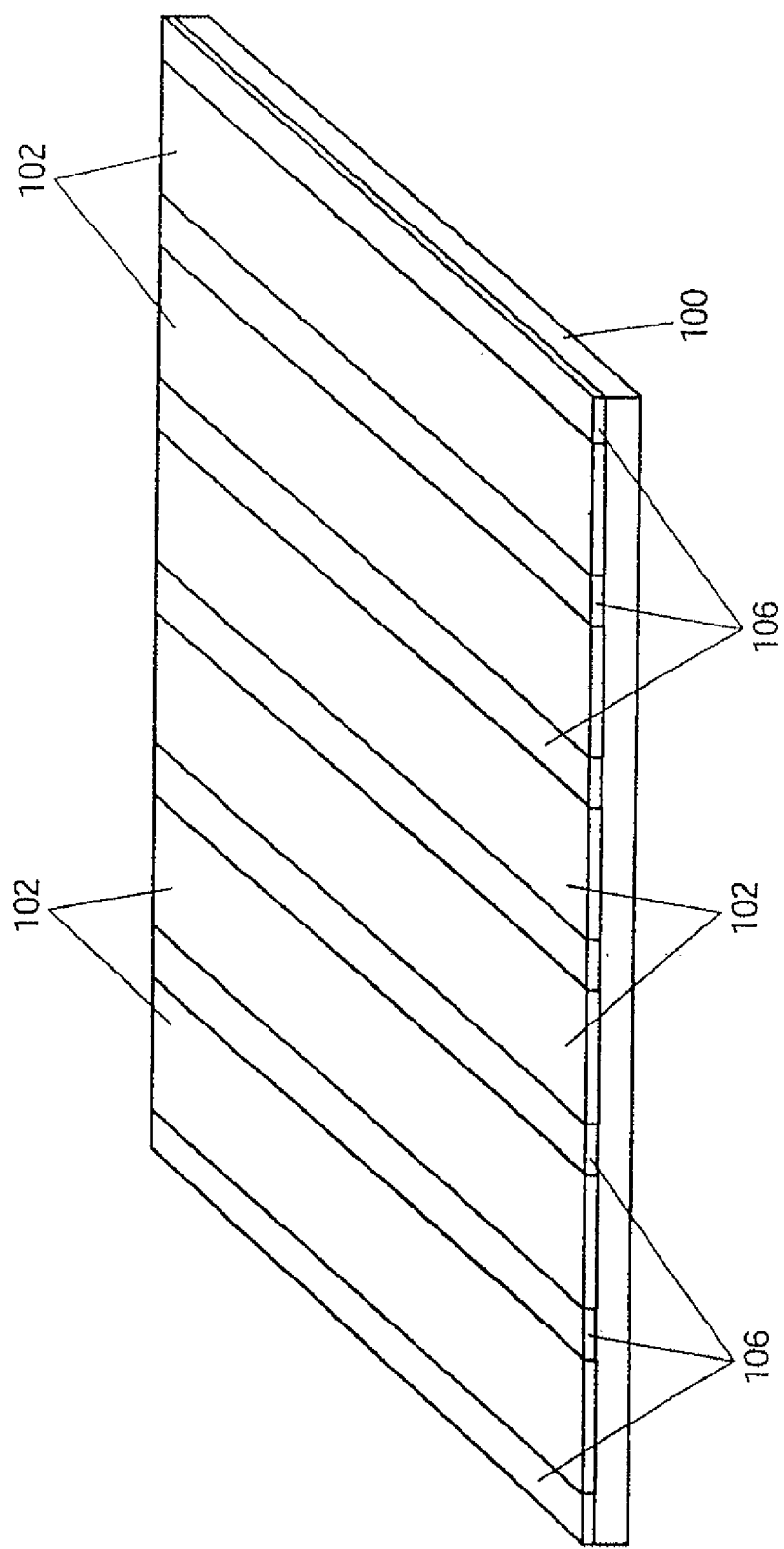
Figure 5:
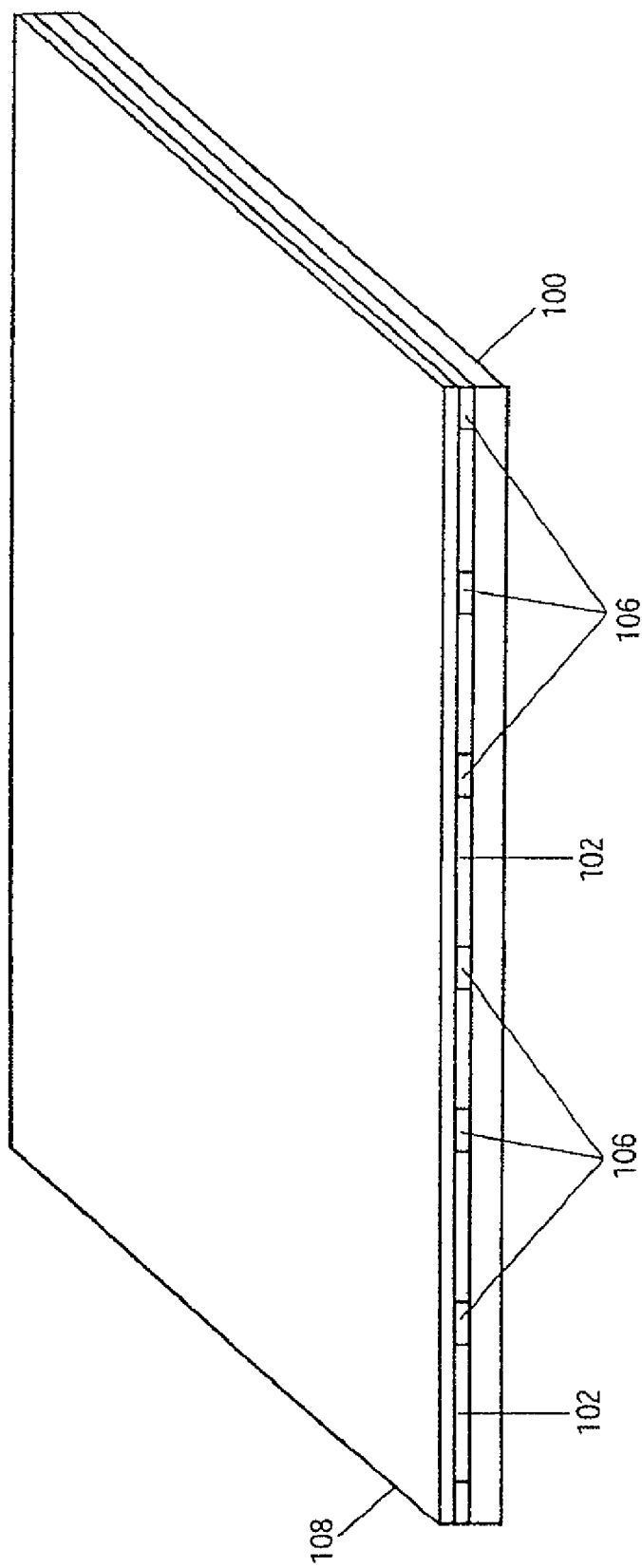

In FIG. 4 of the drawings, a photosensitive polymeric material in the form of a negative-acting-photosensitive material which could be a negative photoresist has been spun onto sacrificial layer 102 with a thickness that is larger than the total height of the film stack defined by layers 100 and 102. Thereafter, the negative-acting-photosensitive material is exposed to ultraviolet light through substrate 100 and developed using conventional techniques. Because the longitudinal grooves 104 are the only means by which the negative-acting-photosensitive material is exposed, the negative-acting-photosensitive material over the stack is dissolved during a subsequent development process, leaving only longitudinal ridges 106 of negative-acting-photosensitive material disposed in grooves 104. Thus, it will be appreciated that by first patterning the sacrificial layer 102 and then exposing the negative-acting-photosensitive material through substrate 100 through longitudinal grooves 104 in the sacrificial layer 102, the sacrificial layer 102 acts as a photomask thereby allowing the negative-acting-photosensitive material to be lithographically patterned without the need for an additional masking step. In FIG. 5 of the drawings, a structural layer 108 has been deposited on the stack and the sacrificial layer 102 has been removed, thus the layer 108 is supported by ridges 106. It will be appreciated that by using different photomasks it will be possible to fabricate support structures of any desired geometry. Thus instead of ridges, in other embodiments pillars or posts may be formed. The layer 108 is highly conductive and reflective and will typically contain aluminum and nickel.

Figure 6:
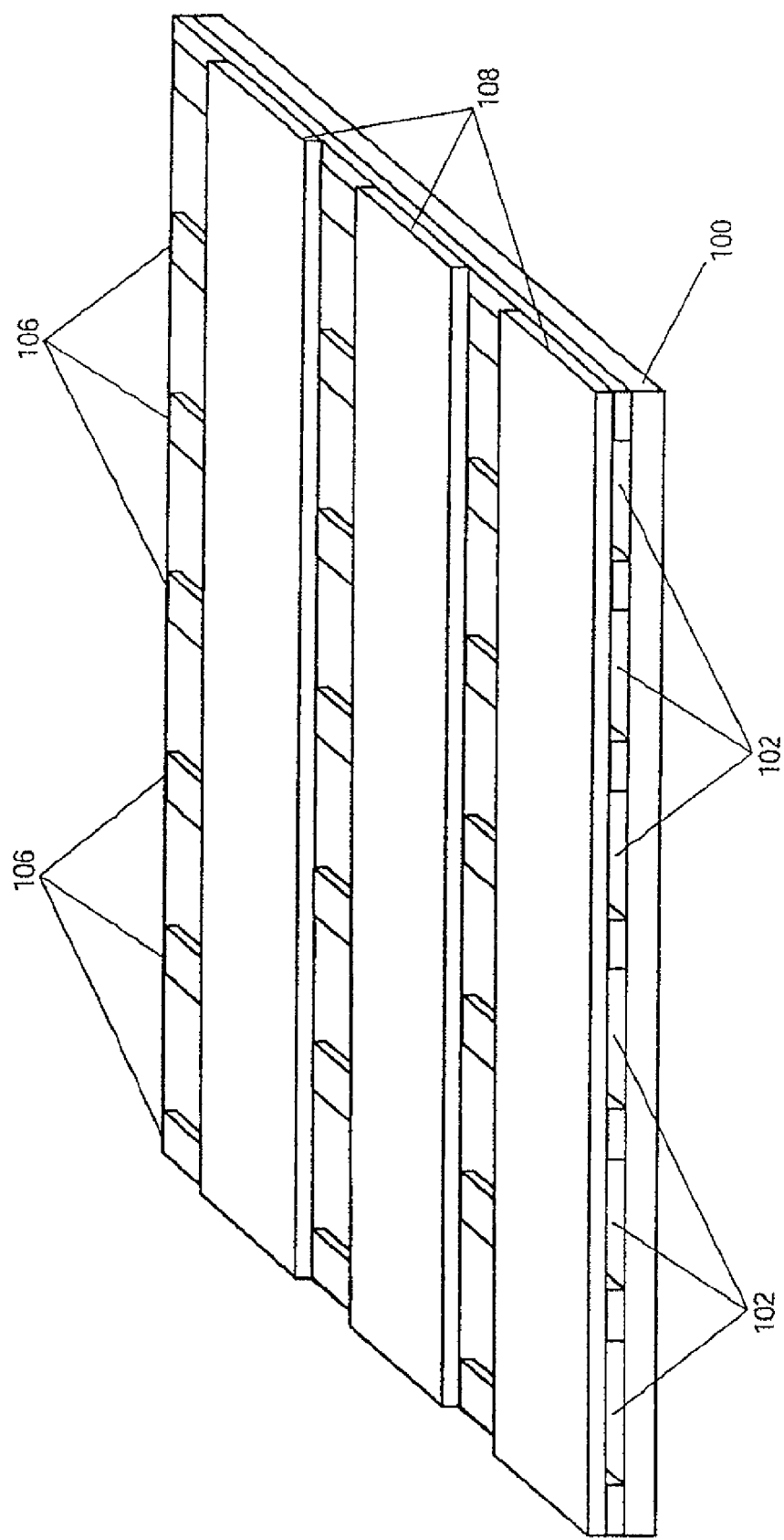
Figure 7:
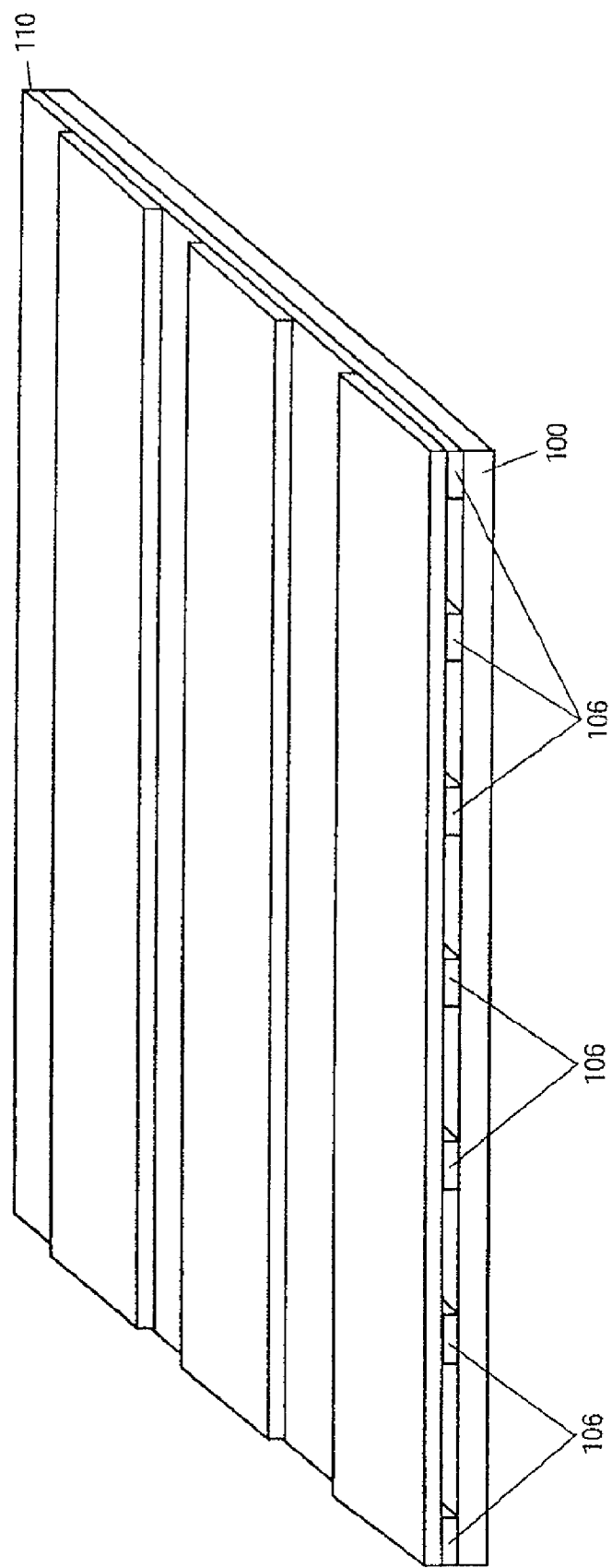
Figure 8:
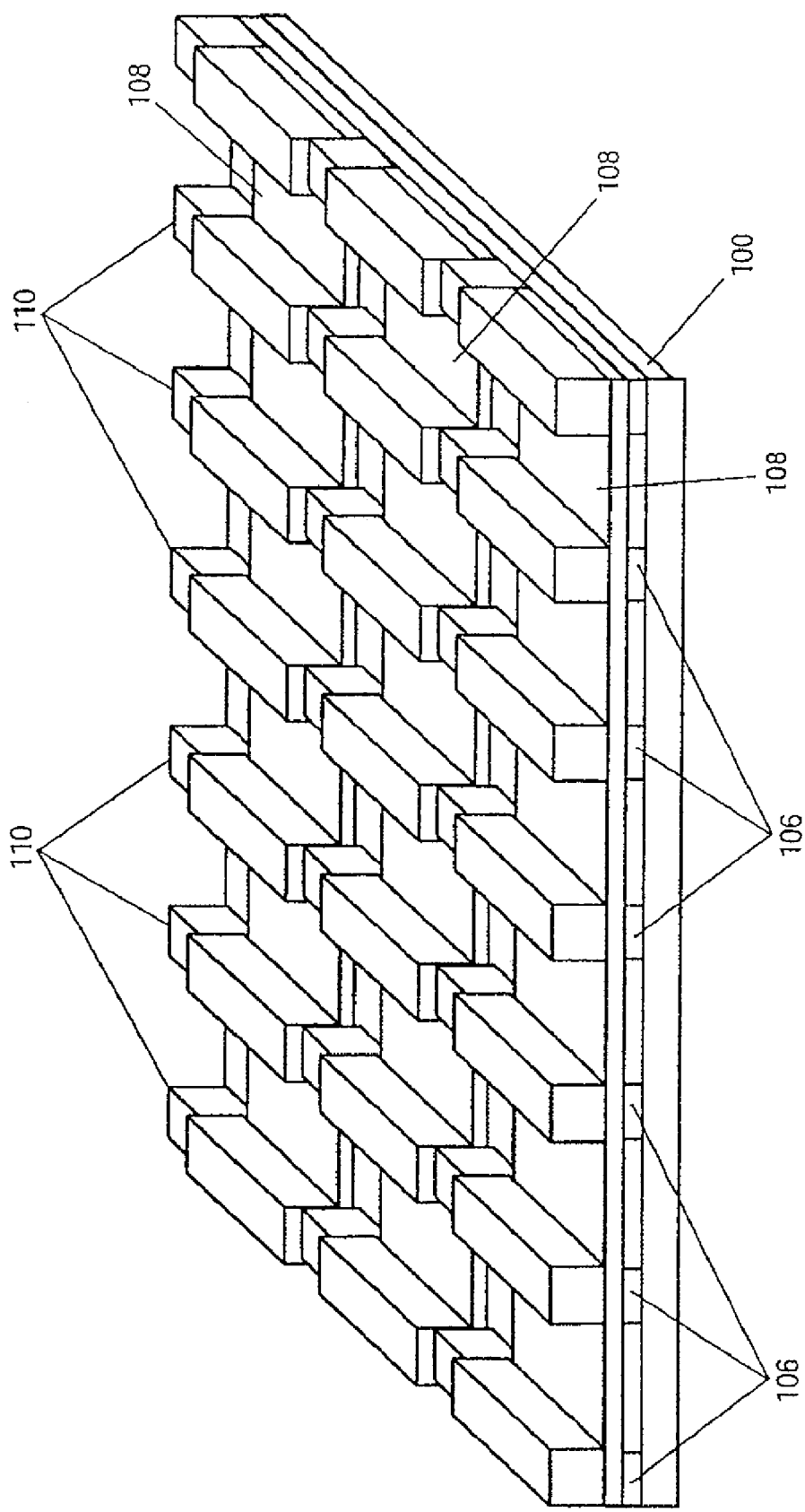
Figure 9:
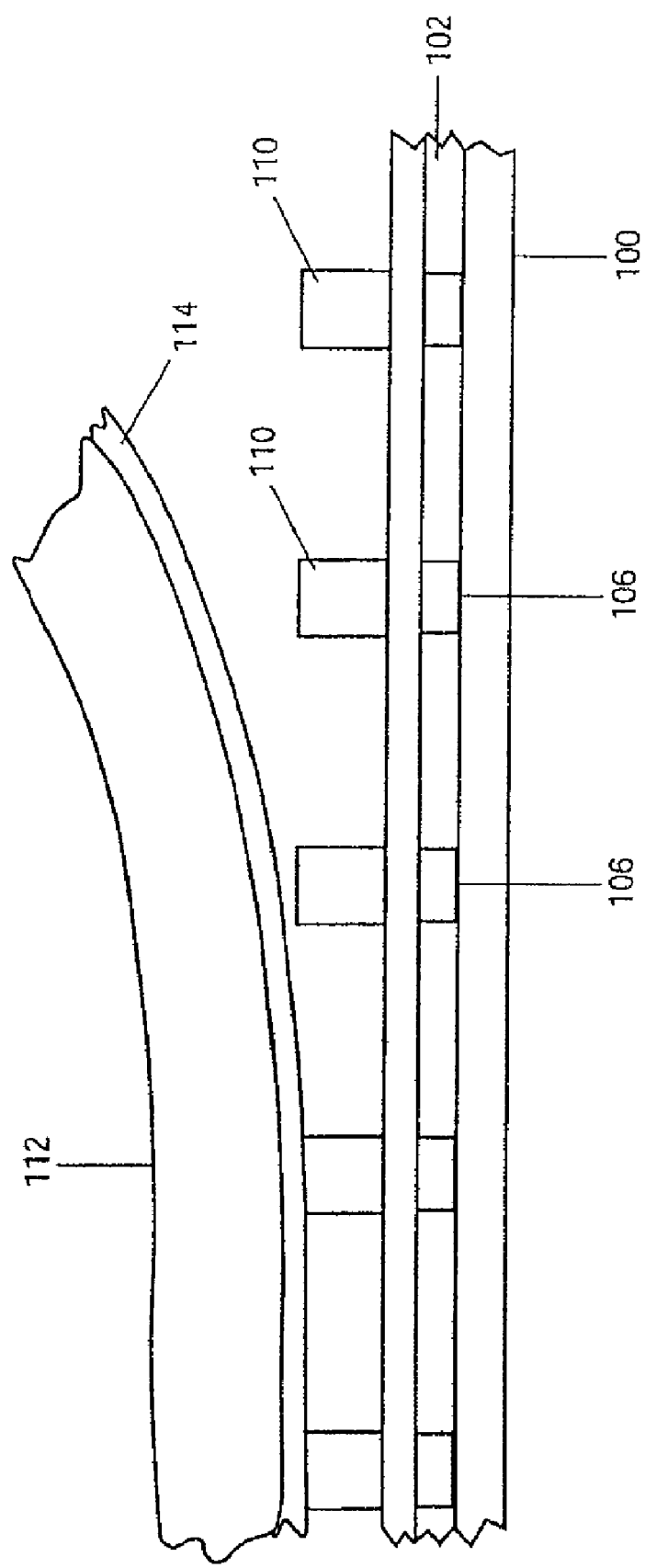
Figure 10:
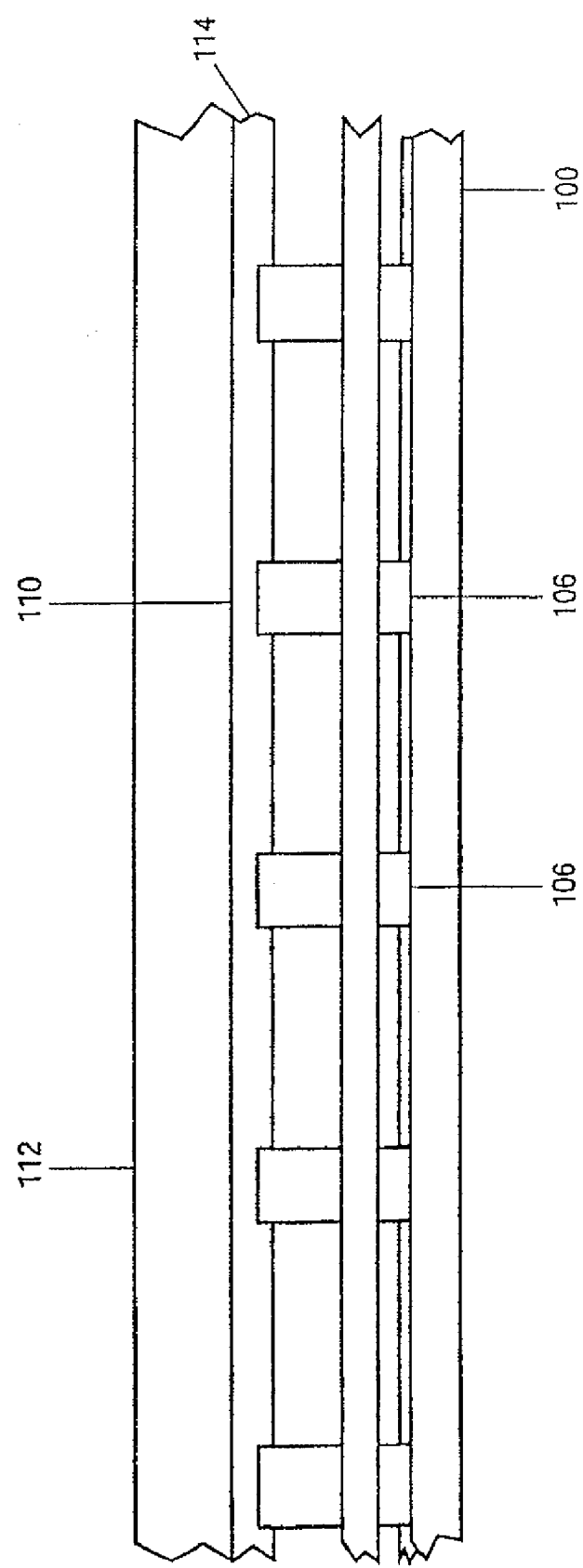

FIG. 6 of the drawings shows a subsequent stage in the manufacture of the MEMS device wherein the layer 108 is patterned into transversely extending strips. FIG. 7 of the drawings shows the film stack with an oxide spacer layer 110 deposited on layer 108. FIG. 8 of the drawings shows a stage in the manufacture of the MEMS device in which the oxide spacer layer 110 has been patterned. FIG. 9 of the drawings shows a stage in the manufacture of the MEMS device in which a sealing film 112 is being applied with a pressure adhesive 114 over the entire structure to protect the structure from damage due to mechanical shock loading and to prevent particulates from interfering with the operation of the IMOD structures. The sealing film 112 could be of a variety of materials such as thin metal films or polymeric films which have been coated with a metal or oxide film to provide hermeticity. Finally, FIG. 10 shows the structure after it has been purged with $XeF_2$ gas to remove the remains of sacrificial layer 102. The edges of the structure are then sealed.

In other embodiments, instead of oxide layer 110 another layer of negative-acting-photosensitive material may be spun over oxide layer 110 and exposed through substrate 100 and using the techniques described above a further set of support structures may be formed. These support structures will provide support for other layers. It will be appreciated that the process may be repeated to build a MEMS structure having multiple layers or "floors" stacked one on top of the other wherein the floors are vertically spaced by support structures fabricated in accordance with the above techniques. One advantage of the present invention is that it provides a microfabrication technique which allows a mechanical support between two layers in an MEMS device to be precisely defined. This allows a clean, well-defined mechanical contact between the support and other structures within the MEMS device.

Further, the present invention uses a patterned layer on a substrate as a photomask to pattern another layer, thereby saving on a masking step.

Although the present invention has been described with reference to specific exemplary embodiments, it will be evident that the various modification and changes can be made to these embodiments without departing from the broader spirit of the invention as set forth in the claims. Accordingly, the specification and drawings are to be regarded in an illustrative sense rather than in a restrictive sense.

What is claimed is:

1. A method of fabricating a microelectromechanical systems (MEMS) device, the method comprising:
   forming at least one layer over a substrate, said layer comprising a sacrificial material;
   patterning said sacrificial layer;
   depositing an additional layer over said sacrificial layer;
   patterning said additional layer using said sacrificial layer as a photomask;
   forming an upper layer over the sacrificial layer; and
   removing said sacrificial layer to form a MEMS cavity through which the upper layer is movable.

2. The method of claim 1, additionally comprising forming a conductive layer over the substrate, wherein the sacrificial layer is formed over the conductive layer.

3. The method of claim 1, wherein the conductive layer is at least partially transmissive to light.

4. The method of claim 1, wherein the conductive layer is substantially transparent.

5. The method of claim 1, wherein the upper layer is conductive.

6. The method of claim 1, wherein the upper layer is at least partially reflective to incident light.

7. The method of claim 1, wherein the upper layer is formed after the patterning of said additional layer, the upper layer being supported by portions of the patterned additional layer.

8. The method of claim 1, wherein the additional layer comprises a negative-acting photoresist.

9. The method of claim 1, wherein the substrate is at least partially transmissive to light.

10. A method of forming a microelectromechanical systems (MEMS) device, the method comprising:
    providing a light-transmissive substrate;
    providing a sacrificial layer over the substrate;
    patterning the sacrificial layer to remove at least a portion of the sacrificial layer;
    providing an additional layer over the sacrificial layer;
    patterning the additional layer by exposing the additional layer to light through the removed portion of the sacrificial layer, wherein patterning the additional layer additionally comprises blocking the light with the remaining portions of the sacrificial layer;
    providing an upper layer over the sacrificial layer; and
    removing the remainder of the sacrificial layer to form a cavity within which the upper layer is movable.

11. The method of claim 10, additionally comprising providing a lower layer, wherein the lower layer is located between the substrate and the sacrificial layer.

12. The method of claim 10, wherein at least a portion of the lower layer is at least partially reflective.

13. The method of claim 10, wherein at least a portion of the lower layer is conductive.

14. The method of claim 13, wherein the conductive portion of the lower layer is substantially transparent to visible light.

15. The method of claim 10, wherein at least a portion of the upper layer is at least partially reflective to visible light.

16. The method of claim 10, wherein at least a portion of the upper layer is conductive.

17. The method of claim 10, wherein the upper layer is provided over and supported by the patterned additional layer.

18. The method of claim 10, wherein the upper layer comprises aluminum or nickel.

19. The method of claim 10, wherein the sacrificial layer is etchable by $XeF_2$.

20. The method of claim 10, wherein the sacrificial layer is not transmissive to light.

21. A method of fabricating a microelectromechanical systems (MEMS) array, the method comprising:

forming a transparent electrode over a substrate, the substrate permitting light to pass therethrough;

forming a sacrificial layer over said transparent electrode, wherein the sacrificial layer is not transmissive to light;

depositing an additional layer over said sacrificial layer;

patterning said additional layer by exposing the additional layer to light through the substrate; and using the patterned additional layer to produce a MEMS structure within the array.

22. The method of claim 21, wherein exposing the additional layer to light through the substrate comprises exposing the additional layer to ultraviolet light through the substrate.

* * * * *